United States Patent
Ahn et al.

(10) Patent No.: US 9,472,786 B2
(45) Date of Patent: Oct. 18, 2016

(54) ORGANIC LIGHT EMITTING DISPLAY DEVICE AND METHOD FOR MANUFACTURING THE SAME

(71) Applicant: LG DISPLAY CO., LTD., Seoul (KR)

(72) Inventors: Byung Chul Ahn, Seoul (KR); Bong Geum Lee, Seoul (KR)

(73) Assignee: LG DISPLAY CO., LTD., Seoul (KR)

(*) Notice: Subject to any disclaimer, the term of this patent is extended or adjusted under 35 U.S.C. 154(b) by 0 days.

(21) Appl. No.: 14/063,935

(22) Filed: Oct. 25, 2013

(65) Prior Publication Data

US 2014/0151655 A1    Jun. 5, 2014

(30) Foreign Application Priority Data

Dec. 4, 2012  (KR) .................. 10-2012-0139929

(51) Int. Cl.
*H01L 51/56* (2006.01)
*H01L 51/52* (2006.01)
*H01L 27/32* (2006.01)

(52) U.S. Cl.
CPC .......... *H01L 51/56* (2013.01); *H01L 27/3276* (2013.01); *H01L 51/5203* (2013.01); *H01L 51/5243* (2013.01)

(58) Field of Classification Search
CPC .......... H01L 51/5243; H01L 51/5228; H01L 51/5225

USPC .................. 257/40, 99, 100, 708, E33.059
See application file for complete search history.

(56) References Cited

U.S. PATENT DOCUMENTS

| | | | |
|---|---|---|---|
| 2004/0079941 A1* | 4/2004 | Yamazaki et al. | 257/40 |
| 2010/0060149 A1 | 3/2010 | Song et al. | |
| 2010/0304162 A1 | 12/2010 | Chong et al. | |
| 2011/0241563 A1* | 10/2011 | Kim et al. | 315/291 |
| 2011/0303930 A1* | 12/2011 | Bang et al. | 257/91 |
| 2012/0169229 A1 | 7/2012 | You et al. | |

FOREIGN PATENT DOCUMENTS

| | | |
|---|---|---|
| CN | 1825621 A | 8/2006 |
| CN | 101901865 A | 12/2010 |
| CN | 102544056 A | 7/2012 |

* cited by examiner

*Primary Examiner* — Shaun Campbell
*Assistant Examiner* — Aneta Cieslewicz
(74) *Attorney, Agent, or Firm* — Birch, Stewart, Kolasch & Birch, LLP (57) ABSTRACT

Discussed is an organic light emitting display device which prevents a voltage drop, wherein the light emitting display device includes a substrate; a first electrode on the substrate; an organic light emitting layer on the first electrode; a second electrode on the substrate including the organic light emitting layer; and an encapsulation substrate confronting the substrate, wherein the encapsulation substrate is formed of a metal material, and is electrically connected with the second electrode.

12 Claims, 6 Drawing Sheets

ORGANIC LIGHT EMITTING DISPLAY DEVICE AND METHOD FOR MANUFACTURING THE SAME

CROSS REFERENCE TO RELATED APPLICATIONS

This application claims the benefit of the Korean Patent Application No. 10-2012-0139929 filed on Dec. 4, 2012, which is hereby incorporated by reference as if fully set forth herein.

BACKGROUND

1. Field of the Invention

Embodiments of the present invention relate to an organic light emitting display device and a method for manufacturing the same.

2. Discussion of the Related Art

According to a recent development of multimedia, there is an increasing demand for a flat panel display. In order to satisfy this increasing demand, various flat panel displays such as liquid crystal display device, plasma display panel, and organic light emitting display device are practically used. Among the various flat panel displays, the organic light emitting display device has been attracted great attentions owing to a rapid response speed. In addition, since internal elements included in the organic light emitting display device are formed of a solid material, the organic light emitting display device has good durability against external forces, and also enables a wide range of use temperature.

Especially, a manufacturing process of the organic light emitting display device is simplified so that it is possible to reduce a manufacturing cost in comparison to a related art liquid crystal display device.

Figure 1:
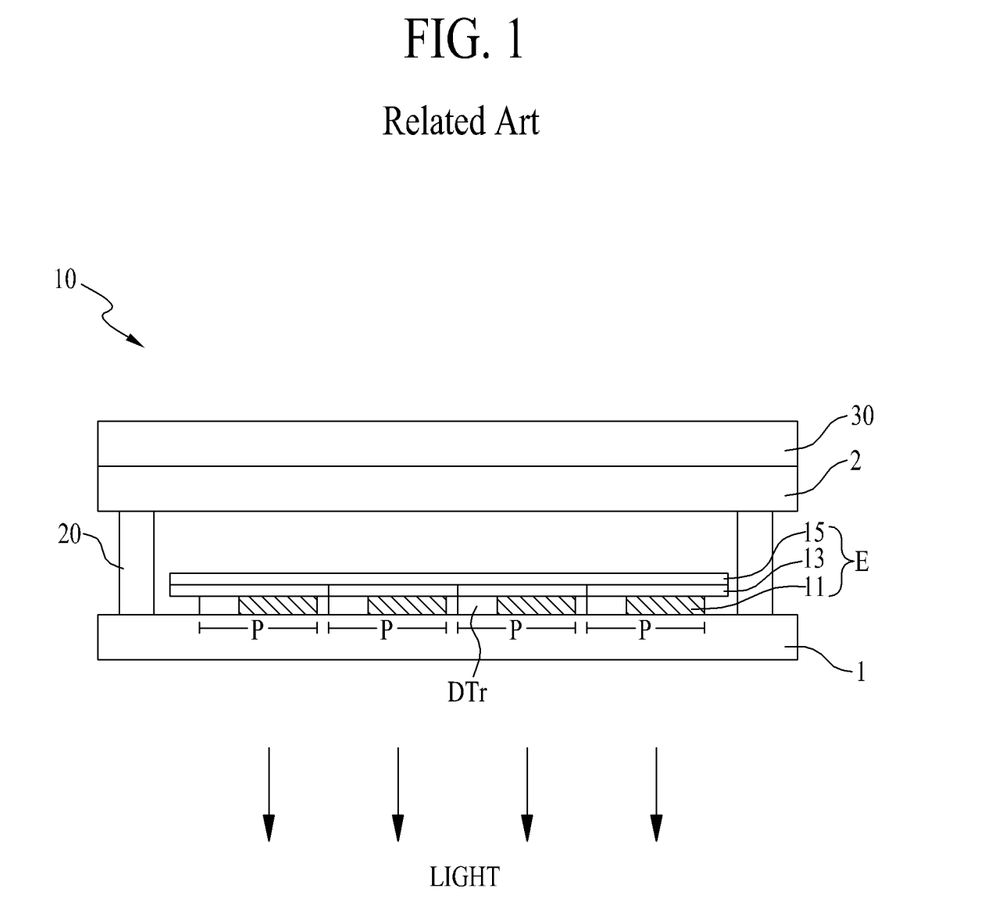
FIG. 1 is a cross sectional view illustrating an organic light emitting display device according to the related art.

FIG. 1 illustrates an organic light emitting display device of a bottom emission type according to the related art.

As shown in FIG. 1, the organic light emitting display device 10 include a first substrate 1, and a second substrate 2 confronting the first substrate 1, wherein the first substrate 1 and the second substrate 2 are provided with a predetermined interval in-between, and are encapsulated and bonded to each other by the use of sealing pattern 20 provided along the edges thereof.

In more detail, a driving thin film transistor (DTr) is formed in each of pixel regions (P) on the first substrate 1. Also, a first electrode 11, an organic light emitting layer 13, and a second electrode 15, which constitute a light emitting diode (E), are sequentially deposited on the first substrate 1. The first electrode 11 is electrically connected with the driving thin film transistor (DTr).

In this case, the first electrode 11 is formed of a transparent conductive material, and the second electrode 15 is formed of an opaque conductive material. Accordingly, light emitted from the organic light emitting layer is guided toward the first electrode 11.

Meanwhile, in order to prevent a lifespan of the organic light emitting display device 10 from being shortened by heat generated for a driving mode and degradation of the driving thin film transistor (DTr), as shown in FIG. 1, a heat insulating plate 30 is attached to an outer surface of the second substrate 2.

According as the organic light emitting display device of the related art is increased in size, an area of the second electrode 15 is increased so that a resistance value is increased, whereby a voltage drop (IR drop) might occur. Also, power consumption is increased by the increase of voltage drop according to the increase of resistance in the second electrode 15, and luminance of the organic light emitting display device is not uniform, whereby it is difficult to realize good reliability in the organic light emitting display device.

There has been proposed a method for increasing a thickness of the second electrode 15 so as to prevent the voltage drop caused by the increase of resistance in the second electrode 15. However, even though the voltage drop can be prevented owing to the increased thickness of the second electrode 15, a manufacturing cost of the organic light emitting display device is raised, and the organic light emitting display device is increased in its weight and thickness.

Especially, since the organic light emitting display device of the related art uses the carbon-based heat insulating plate, the organic light emitting display device of the related art is more increased in its weight and thickness.

SUMMARY

Accordingly, embodiments of the present invention are directed to an organic light emitting display device and a method for manufacturing the same that substantially obviates one or more problems due to limitations and disadvantages of the related art.

An aspect of embodiments of the present invention is to provide an organic light emitting display device which is capable of preventing a voltage drop, and a method for manufacturing the same.

Another aspect of embodiments of the present invention is to provide an organic light emitting display device which has light weight and thin thickness, and a method for manufacturing the same Additional advantages and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these and other advantages and in accordance with the purpose of the invention, as embodied and broadly described herein, there is provided an organic light emitting display device that may include a substrate; a first electrode on the substrate; an organic light emitting layer on the first electrode; a second electrode on the substrate including the organic light emitting layer; and an encapsulation substrate confronting the substrate, wherein the encapsulation substrate is formed of a metal material, and is electrically connected with the second electrode.

In another aspect of an embodiment of the present invention, there is provided a method for manufacturing an organic light emitting display device that may include forming a first electrode on a predetermined region of a substrate; forming an organic light emitting layer on the first electrode; forming a second electrode on the substrate including the organic light emitting layer; and bonding an encapsulation substrate of a metal material to the substrate so as to electrically connect the encapsulation substrate and the second electrode to each other.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the exemplary embodiments of the present invention, examples of which are illustrated in the accompanying drawings. Wherever possible, the same reference numbers will be used throughout the drawings to refer to the same or like parts.

On explanation about the embodiments of the present invention, the following details about the terms should be understood.

The term of a singular expression should be understood to include a multiple expression as well as the singular expression if there is no specific definition in the context. If using the term such as "the first" or "the second", it is to separate any one element from other elements. Thus, a scope of claims is not limited by these terms.

Also, it should be understood that the term such as "include" or "have" does not preclude existence or possibility of one or more features, numbers, steps, operations, elements, parts or their combinations.

It should be understood that the term "at least one" includes all combinations related with any one item. For example, "at least one among a first element, a second element and a third element" may include all combinations of the two or more elements selected from the first, second and third elements as well as each element of the first, second and third elements.

Also, if it is mentioned that a first element is positioned "on or above" a second structure, it should be understood that the first and second elements may be brought into contact with each other, or a third element may be interposed between the first and second elements. However, if using "right on or right above", it should be understood that the first and second elements are brought into contact with each other.

Hereinafter, an organic light emitting display device according to embodiments of the present invention and a method for manufacturing the same will be described in detail with reference to the accompanying drawings.

Figure 2:
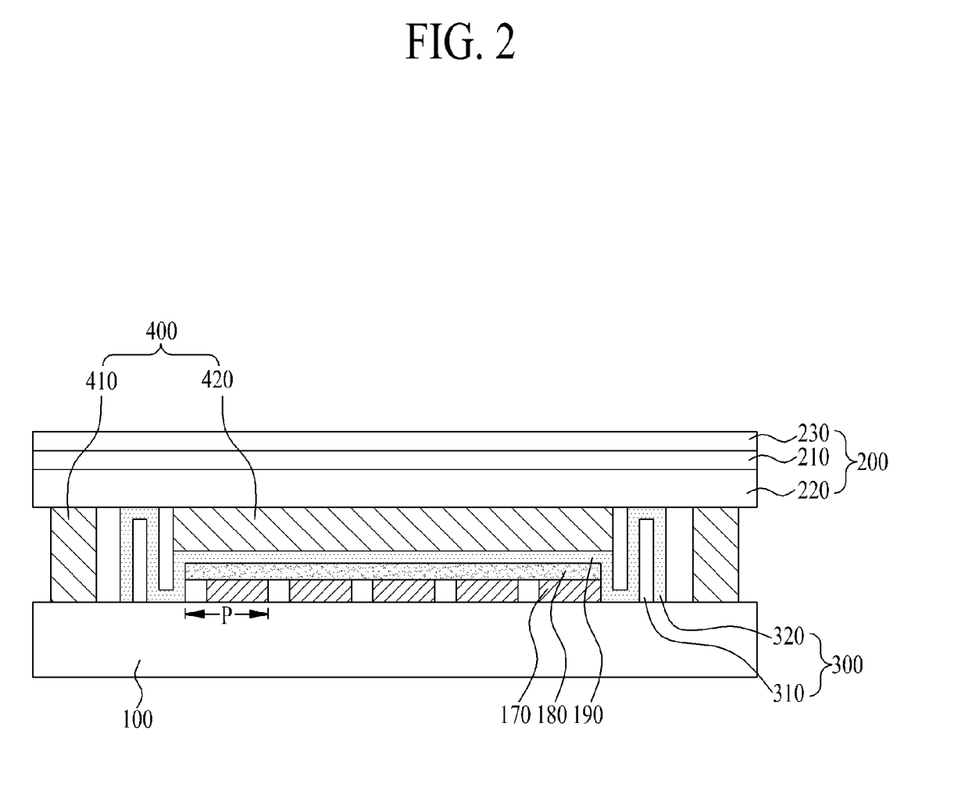
FIG. 2 is a cross sectional view illustrating an organic light emitting display device according to one embodiment of the present invention.

FIG. 2 is a cross sectional view illustrating an organic light emitting display device according to one embodiment of the present invention.

Generally, according to a transmission direction of emitted light, an organic light emitting display device may be classified into a top emission type and a bottom emission type. Referring to FIG. 2, the organic light emitting display device according to one embodiment of the present invention may be the bottom emission type.

As shown in FIG. 2, the organic light emitting display device according to one embodiment of the present invention may include a substrate 100, an encapsulation substrate 200, an auxiliary electrode 300, and a sealing pattern 400.

First, the substrate 100 may include a thin film transistor (TFT) region and a light emitting diode region. A pixel (P) may be defined by combination of the TFT region and the light emitting diode region.

A thin film transistor formed in the TFT region of the substrate 100 and a light emitting diode formed in the light emitting diode region will be described in detail with reference to FIG. 3.

Figure 3:
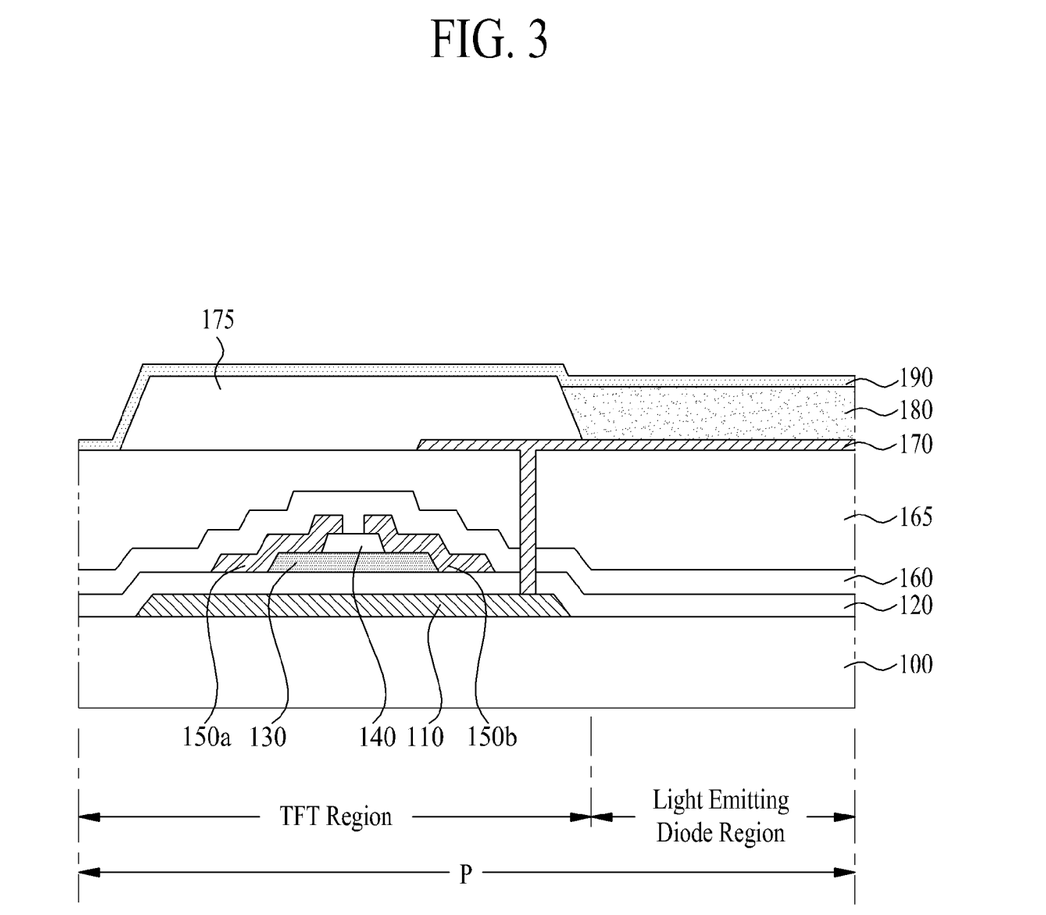
FIG. 3 is a cross sectional view illustrating a pixel of FIG. 2.

FIG. 3 is a cross sectional view illustrating the expanded pixel shown in FIG. 2. As shown in FIG. 3, the thin film transistor including a gate electrode 110, an active layer 130, an etch stopper 140, a source electrode 150a and a drain electrode 150b is formed in the TFT region. Although not shown, a color filter layer may be additionally formed in the TFT region.

Also, the light emitting diode including a first electrode 170, an organic light emitting layer 180 and a second electrode 190 is formed in the light emitting diode region.

In more detail, the organic light emitting display device according to one embodiment of the present invention may include the substrate 100, the gate electrode 110, a gate insulating film 120, the active layer 130, the etch stopper 140, the source electrode 150a, the drain electrode 150b, a passivation film 160, a planarization layer 165, the first electrode 170, a bank layer 175, the organic light emitting layer 180, and the second electrode 190.

Generally, the substrate 100 is formed of glass. However, the substrate 100 may be formed of transparent plastic with flexibility, for example, polyimide. If forming the substrate 100 of polyimide, it is necessary to use polyimide with good heat-resistance, which endures a high temperature, due to a high-temperature deposition process on the substrate 100.

The gate electrode 110 is patterned on the substrate 100. The gate electrode 110 may be formed of molybdenum (Mo), aluminum (Al), chrome (Cr), aurum (Au), titanium (Ti), nickel (Ni), neodymium (Nd), copper (Cu), or their alloys. Also, the gate electrode 110 may be formed in a single-layered structure of the above metal materials or their alloys, or may be formed in a multi-layered structure of the above metal materials or their alloys.

The gate insulating film 120 is formed on the gate electrode 110, wherein the gate insulating film 120 electrically insulates the gate electrode 110 from the active layer 130. The gate insulating film 120 may be formed of an inorganic insulating material such as silicon oxide or silicon nitride, but not limited to these materials. For example, the gate insulating film 120 may be formed of an organic insulating material such as photoacryl or benzocyclobutene (BCB).

The active layer 130 is patterned on the gate insulating film 120. The active layer 130 may overlap with the gate electrode 110. The active layer 130 may be formed of an oxide semiconductor such as In—Ga—Zn—O (IGZO), but not limited to this material. For example, the active layer 130 may be formed of a silicon-based semiconductor.

The etch stopper 140 is patterned on the active layer 130. The etch stopper 140 prevents a channel region of the active layer 130 from being etched during an etching process for patterning the source electrode 150a and the drain electrode 150b. The etch stopper 140 may be formed of an inorganic insulating material such as silicon oxide or silicon nitride, but not limited to these materials. If needed, it is possible to omit the etch stopper 140.

The source electrode 150a and the drain electrode 150b facing each other are patterned on the etch stopper 140. The source electrode 150a provided on the etch stopper 140 extends in one direction of the active layer 130, whereby the extending source electrode 150a is connected with the active layer 130. Meanwhile, the drain electrode 150b provided on the etch stopper 140 extends in the other direction of the active layer 130, whereby the extending drain electrode 150b is connected with the active layer 130. The source electrode 150a and the drain electrode 150b may be formed of molybdenum (Mo), aluminum (Al), chrome (Cr), aurum (Au), titanium (Ti), nickel (Ni), neodymium (Nd), copper (Cu), or their alloys. Also, each of the source electrode 150a and the drain electrode 150b may be formed in a single-layered structure of the above metal materials or their alloys, or may be formed in a multi-layered structure of the above metal materials or their alloys.

The passivation film 160 is formed on the source electrode 150a and the drain electrode 150b. The passivation film 160 may be formed of an inorganic insulating material such as silicon oxide or silicon nitride, but not limited to these materials. For example, the passivation film 160 may be formed of an organic insulating material such as photoacryl or benzocyclobutene (BCB).

The planarization layer 165 is formed on the gate insulating film 120, thereby enabling good step coverage of the organic light emitting display device. The planarization layer 165 may be formed of an organic insulating material such as photoacryl or benzocyclobutene (BCB).

The first electrode 170 is patterned on the planarization layer 165. The first electrode 170 is connected with the drain electrode 150b through a contact hole provided in the planarization layer 165 and the passivation film 160. The organic light emitting display device according to the present invention is the bottom emission type. Thus, the first electrode 170 may be formed of a transparent conductive material having a high work function value, for example, Indium-Tin-Oxide (ITO) or Indium-Zinc-Oxide (IZO), whereby the first electrode 170 may function as an anode electrode.

The bank layer 175 is formed on the planarization layer 165. In detail, the bank layer 175 is patterned to overlap with the thin film transistor, and the light emitting diode region is defined by the bank layer 175. The bank layer 175 may be formed of an organic insulating material, for example, polyimide, photoacryl or benzocyclobutene (BCB), but not limited to these materials.

The organic light emitting layer 180 is formed on the first electrode 170. Although not shown, the organic light emitting layer 180 may be formed in a deposition structure of hole injection layer/hole transport layer/organic light emitting layer/electron transport layer/electron injection layer. In this case, it is possible to omit one, two or more layers among the hole injection layer, the hole transport layer, the electron transport layer and the electron injection layer. The organic light emitting layer 180 may emit the light having the same color for the respective pixels, for example, white-colored light, or may emit the light having the different colors for the respective pixels, for example, red-colored light, green-colored light, or blue-colored light.

The second electrode 190 is formed on the organic light emitting layer 180. The second electrode 190 may be commonly applied to all pixels without being divided by each pixel. That is, the second electrode 190 may be formed on the bank layer 175 as well as the organic light emitting layer 180. As mentioned above, the organic light emitting display device according to the present invention is the bottom emission type. Thus, the second electrode 190 may be formed of an opaque conductive material, whereby the second electrode 190 may function as a cathode electrode. For example, the second electrode 190 may be formed of a metal material whose work function value is relatively lower than that of the first electrode 170, for example, any one metal material selected from aluminum (Al), aluminum alloy (AlNd), argentum (Ag), magnesium (Mg), aurum (Au) and aluminum magnesium alloy (AlMg).

The thin film transistor shown in FIG. 3 is only one example. That is, the thin film transistor may vary in structure. For example, the thin film transistor of FIG. 3 has a bottom gate structure where the gate electrode 110 is provided below the active layer 130. According to a modified embodiment of the present invention, the thin film transistor may have a top gate structure where the gate electrode 110 is provided above the active layer 130.

Referring once again to FIG. 2, the encapsulation substrate 200 is bonded to the substrate 100 while being confronted with the substrate 100, which enables encapsulation of the organic light emitting display device. As shown in FIG. 2, the encapsulation substrate 200 may include a base film 210, a connection layer 220, and a metal oxide layer 230.

The base film 210 may be formed of a metal material. According to one embodiment of the present invention, the base film 210 included in the encapsulation substrate 200 may be formed of a metal material containing magnesium (Mg).

In the present invention, the base film 210 is formed of the metal material containing magnesium (Mg). This is because magnesium (Mg) enables a heat insulating function owing to high thermal conductivity. Thus, since the base film 210 included in the encapsulation substrate 200 is formed of the metal material containing magnesium (Mg), the organic light emitting display device of the present invention does not require a heat insulating plate such as a related art fan or heat pipe so that it is possible to realize thinness and lightness in the organic light emitting display device of the present invention.

The connection layer 220 is formed on a first surface corresponding to one surface of the base film 210 confronting the substrate 100. The connection layer 220 is electrically connected with the second electrode 190 formed on the substrate 100 through the auxiliary electrode 300.

Accordingly, the connection layer 220 may be formed of a conductive metal material. According to one embodiment of the present invention, the connection layer 220 may be formed of an alloy using magnesium (Mg) which is the metal materials for the base film 210 and any one among argentum (Ag), titanium (Ti), tungsten (W), and iron (Fe).

According to one embodiment of the present invention, the connection layer 220 may be formed by performing a plasma treatment on the first surface of the base film 210 through the use of any one metal material selected from argentum (Ag), titanium (Ti), tungsten (W) and iron (Fe).

Then, the metal oxide layer 230 is formed on a second surface of the base film 210 which is opposite to the first surface of the base film 210, wherein the connection layer 220 is formed on the first surface of the base film 210. In the present invention, the metal oxide layer 230 is formed on the second surface of the base film 210. This is because such structure facilitates to insulate the base film 210 from the external, and also to uniformly oxidize the entire area of the base film 210 of magnesium (Mg).

According to one embodiment of the present invention, the metal oxide layer 230 may be formed by anodizing the second surface of the base film 210.

In this case, the above anodizing is a plating technique. That is, under the condition that the second surface of the base film 210 is immersed in electrolytic solution, an electric current is applied to the base film 210 functioning as an anode, whereby the second surface of the base film 210 is oxidized by oxygen generated from the anode.

In the present invention, the base film 210 is formed at a predetermined thickness by the use of magnesium (Mg). Thus, instead of oxidizing the entire area of the base film 210, only the second surface of the base film 210 is changed into magnesium oxide (MgO), and the metal oxide layer 230 is formed on the second surface of the base film 210.

In the above embodiment of the present invention, the metal oxide layer 230 is formed by the anodizing, but not limited to this method. The metal oxide layer 230 may be formed by various methods. For example, the metal oxide layer 230 may be formed by performing a plasma treatment on the second surface of the base film 210.

In the present invention, the surface of the encapsulation substrate 200, which confronts the substrate 100, is formed of a conductive alloy, and is also electrically connected with the second electrode 190, thereby reducing a resistance of the second electrode 190, and preventing a voltage drop.

Also, since the base film 210 of the encapsulation substrate 200 is formed of magnesium (Mg) with good thermal conductivity, the organic light emitting display device of the present invention can improve heat insulating efficiency without using additional heat insulating plate. In addition, the additional heat insulating plate is not used in the organic light emitting display device of the present invention so that it is possible to realize thinness and lightness in the organic light emitting display device according to the present invention.

Then, the auxiliary electrode 300 electrically connects the second electrode 190 with the encapsulation substrate 200. As shown in FIG. 2, the auxiliary electrode 300 may include a barrier 310 and a connection electrode 320.

Figure 4:
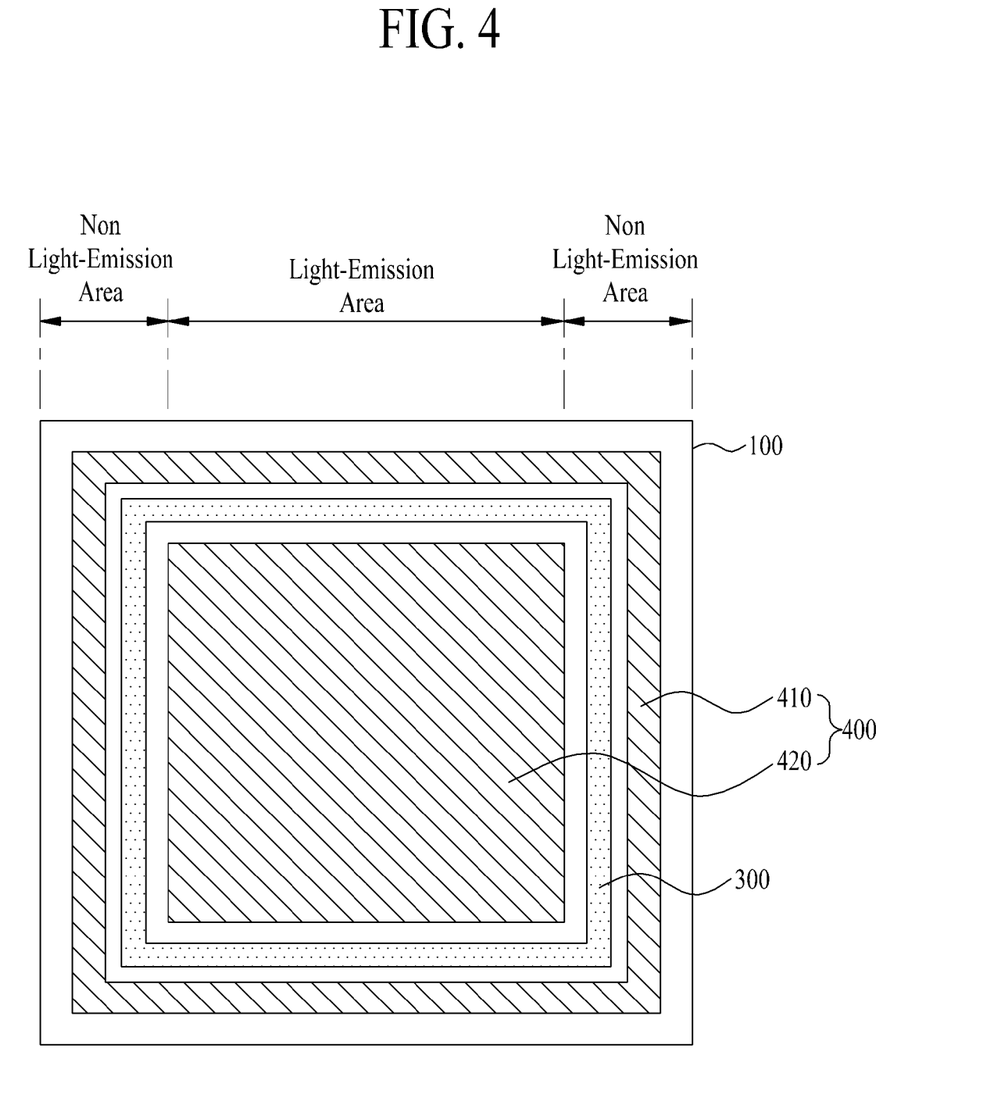
FIG. 4 is a plane view illustrating the organic light emitting display device according to one embodiment of the present invention.

The barrier 310 having a predetermined height is formed in a non light-emission area of the substrate 100 so that the connection electrode 320 is brought into contact with the encapsulation substrate 200. According to one embodiment of the present invention, as shown in FIG. 4, the barrier 310 may be formed in a closed loop of a frame shape in the circumference of light-emission area on the substrate 100.

If satisfying that the barrier 310 has the predetermined height enabling to bring the connection electrode 320 into contact with the encapsulation substrate 200, the barrier 310 may be formed of any material without limitation.

According to one embodiment of the present invention, the barrier 310 may be formed in the same layer structure as that of the thin film transistor by the use of material for forming the thin film transistor, or may be formed by the use of some layers among the layers included in the thin film transistor.

Also, the barrier 310 may be formed by additionally depositing at least one of the planarization layer 160, the first electrode 170, and the bank layer 175 on at least some layers among the layers included in the thin film transistor.

According to a first example, the barrier 310 may have a layer structure in such a manner that the gate electrode 110 is formed, the gate insulating film 120 is formed on the gate electrode 110, the active layer 130 is formed on the gate insulating film 120, the etch stopper 140 is formed on the active layer 130, the source and drain electrodes 150a and 150b are formed on the etch stopper 140, the passivation film 160 is formed on the source and drain electrodes 150a and 150b, and the planarization layer 165 is formed on the passivation film 160.

According to a second example, the barrier 310 may have a layer structure in such a manner that the first electrode 170 and the bank layer 175 are sequentially deposited on the layer structure shown in the above first example, or may have a layer structure in such a manner that any one of the first electrode 170 and the bank layer 175 is additionally deposited on the layer structure shown in the above first example.

In addition, the barrier 310 may have a layer structure in such a manner that the gate electrode 110, the source and drain electrodes 150a and 150b, and the first electrode 170 are sequentially deposited; may have a layer structure in such a manner that the gate electrode 110, the source and drain electrodes 150a and 150b, the first electrode 170, and the bank layer 175 are sequentially deposited; may have a layer structure in such a manner that the gate electrode 110, the gate insulating film 120, the source and drain electrodes 150a and 150b, and the first electrode 170 are sequentially deposited; or may have a layer structure in such a manner that the gate electrode 110, the gate insulating film 120, the source and drain electrodes 150a and 150b, the first electrode 170, and the bank layer 175 are sequentially deposited.

Then, the connection electrode 320 is formed on the barrier 310, and is brought into contact with the encapsulation substrate 200. According to one embodiment of the present invention, as shown in FIG. 2, the connection electrode 320 may be formed as one body with the second electrode 190.

According as the connection electrode 320 of the present invention is formed as one body with the second electrode 190, and is simultaneously brought into contact with the encapsulation substrate 200, the second electrode 190 is electrically connected with the encapsulation substrate 200, whereby a surface resistance of the second electrode 190 is reduced without increasing a thickness of the second electrode 190, thereby preventing a voltage drop caused by the second electrode 190.

Referring once again to FIG. 2, the sealing pattern 400 is interposed between the substrate 100 and the encapsulation substrate 200, thereby bonding the substrate 100 and the encapsulation substrate 200 to each other. The sealing pattern 400 may vary in shape.

For example, as shown in FIGS. 2 to 4, the sealing pattern 400 may include a first sealing pattern 410 formed in a closed loop of a frame shape surrounding the auxiliary electrode 300 on the circumference of auxiliary electrode 300, or may additionally include a second sealing pattern 420 for covering the light emission area inside the auxiliary electrode 300.

Hereinafter, a method for manufacturing the organic light emitting display device according to one embodiment of the present invention will be described in detail as follows.

FIGS. 5A to 5D are cross sectional views illustrating a process for manufacturing the organic light emitting display device according to one embodiment of the present invention, which relate to a process for manufacturing the organic light emitting display device shown in FIGS. 2 and 3. Hereinafter, a detailed explanation for the material and structure of each element will be omitted.

Figure 5A:
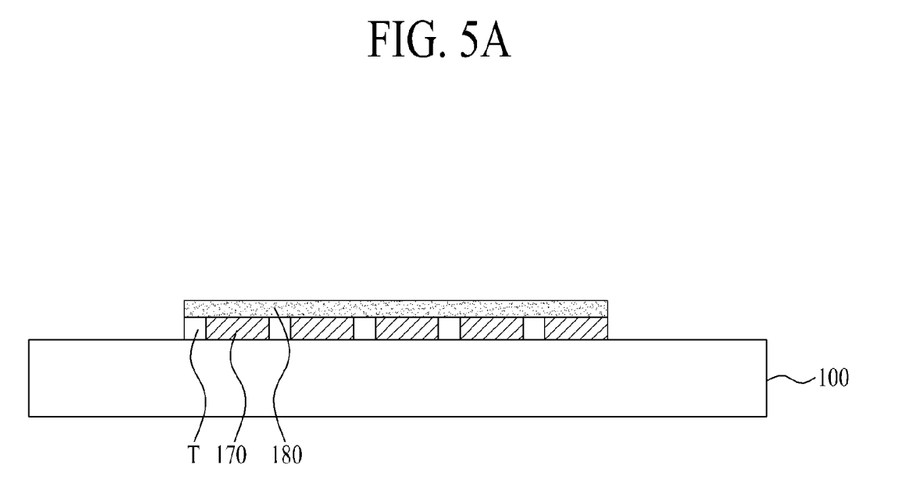
FIGS. 5A to 5D are cross sectional views illustrating a process for manufacturing the organic light emitting display device according to one embodiment of the present invention.

First, as shown in FIG. 5A, the thin film transistor (T) is formed on the substrate 100, and the first electrode 170 electrically connected with the thin film transistor (T) is formed on the substrate 100. Then, the organic light emitting layer 180 is formed on the first electrode 170.

In this case, the thin film transistor (T) may be manufactured by the general process for forming the thin film transistor (T). Also, the process for manufacturing the thin film transistor (T) is not a main point, whereby a detailed explanation for the manufacturing process of the thin film transistor (T) will be omitted.

Figure 5B:
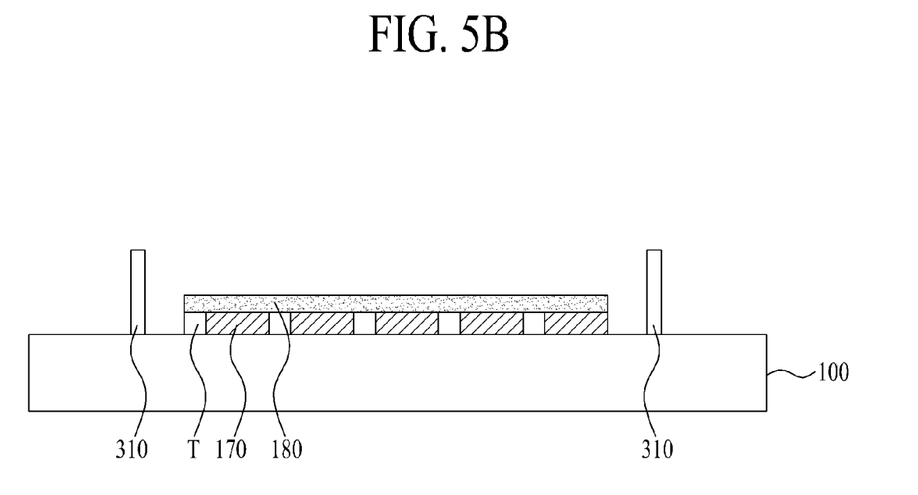

Then, as shown in FIG. 5B, the barrier 310 is formed in the non light-emission area of the substrate 100. According to one embodiment of the present invention, the barrier 310 may be formed in the closed loop of the frame shape in the circumference of light-emission area on the substrate 100.

For convenience of explanation, FIG. 5B illustrates that the barrier 310 is formed after the thin film transistor (T), the first electrode 170, and the organic light emitting layer 180, but not limited to this method.

For example, the barrier 310 may be manufactured together with the thin film transistor (T), the first electrode 170, and the organic light emitting layer 180, at the same time; or may be manufactured during the process of forming the thin film transistor (T) before forming the first electrode 170 and the organic light emitting layer 180.

For example, the barrier 310 may be formed in the same layer structure as that of the thin film transistor (T) by the use of material for forming the thin film transistor (T) during the process of forming the thin film transistor (T), or may be formed by additionally depositing at least one of the planarization layer 160, the first electrode 170, and the bank layer 175 on at least some layers among the layers included in the thin film transistor.

Figure 5C:
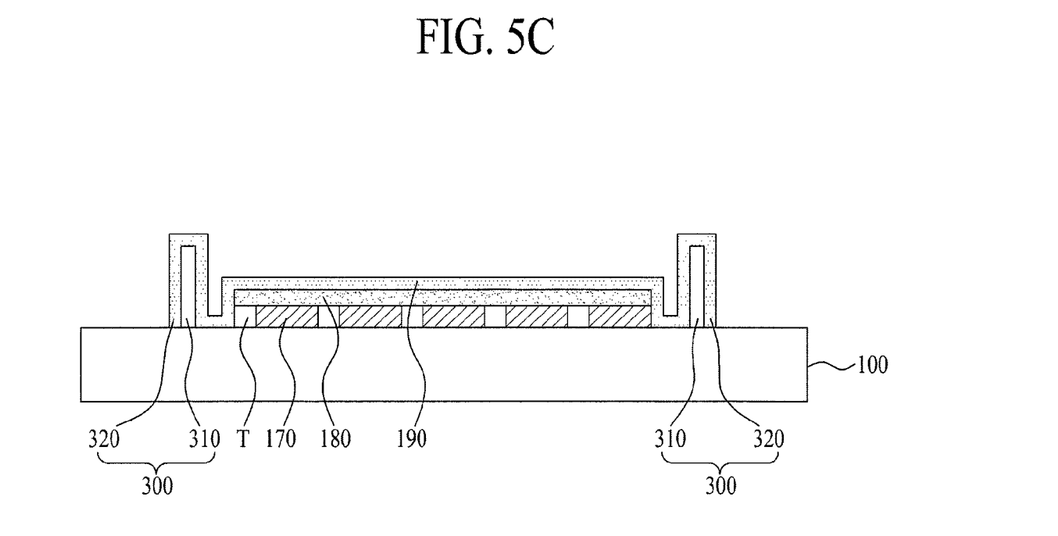

As shown in FIG. 5C, the second electrode 190 is formed on the substrate 100 including the organic light emitting layer 180 and the barrier 310. The second electrode 190 is provided in such a manner that the second electrode 190 is commonly applied to all pixels without being divided by each pixel. In this case, the second electrode 190 provided on the barrier 310 forms the connection electrode 320, whereby the auxiliary electrode 300 is formed on the substrate 100.

Figure 5D:
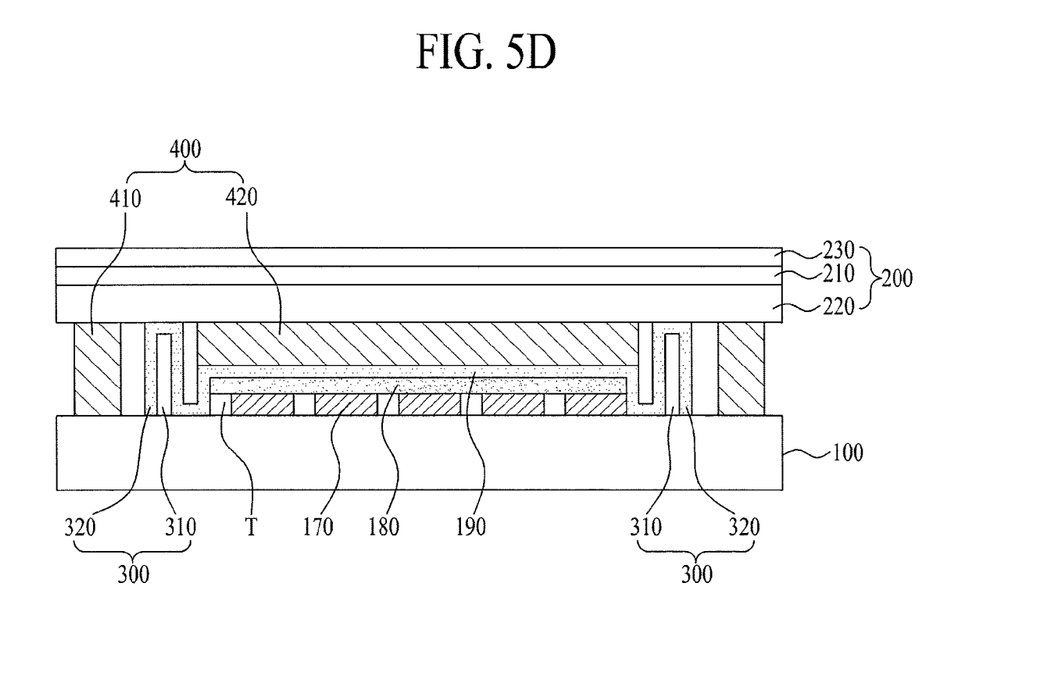

Then, as shown in FIG. 5D, the substrate 100 and the encapsulation substrate 200 are bonded to each other by the use of sealing pattern 400. In this case, the sealing pattern 400 may include the first sealing pattern 410 surrounding the auxiliary electrode 300 in the circumference of auxiliary electrode 300, and the second sealing pattern 420 covering the light-emission area inside the auxiliary electrode 300.

Meanwhile, when bonding the substrate 100 and the encapsulation substrate 200 to each other, the encapsulation substrate 200 is brought into contact with the auxiliary electrode 300. According as the auxiliary electrode 300, which is electrically connected with the second electrode 190, is electrically connected with the encapsulation substrate 200, it is possible to prevent the voltage drop caused by the resistance of the second electrode 190.

According to one embodiment of the present invention, the encapsulation substrate 200 may be manufactured by forming the connection layer 220 on the first surface of the base film 210 of magnesium (Mg) through the use of alloy of magnesium (Mg) and any one selected from argentum (Ag), titanium (Ti), tungsten (W) and iron (Fe); and forming the metal oxide layer 230 through the anodizing treatment on the second surface of the base film 210. In this case, the connection layer 200 may be formed by performing the plasma treatment on the first surface of the base film 210.

The first surface of the base film 210 indicates the surface being connected with the second electrode 190, and the second surface of the base film 210 indicates the surface being opposite to the surface provided with the connection layer 220.

In the above embodiment of the present invention, the metal oxide layer 230 is formed by the anodizing technique, but not limited to this method. The metal oxide layer 230 may be manufactured by the various methods. For example, the metal oxide layer 230 may be manufactured by performing the plasma treatment on the second surface of the base film 210.

According to the present invention, the surface of the encapsulation substrate 200, which confronts with the substrate 100, is formed of a conductive alloy, and the surface of the encapsulation substrate 200 is electrically connected with the auxiliary electrode 300, whereby it is possible to reduce the resistance of the second electrode 190, and thus to prevent the voltage drop.

In the present invention, the base film 210 of the encapsulation substrate 200 is formed of the metal material containing magnesium (Mg) with good thermal conductivity. Thus, it is possible to improve the heat insulating efficiency in the organic light emitting display device even though there is no additional heat insulating plate. In addition, the organic light emitting display device of the present invention does not require the additional heat insulating plate so that it is possible to realize thinness and lightness in the organic light emitting display device of the present invention.

According to the present invention, the encapsulation substrate 200 of the metal material is electrically connected with the second electrode 190 so that it is possible to prevent the voltage drop, which is caused by the resistance increase of the second electrode 190, without increasing the thickness of the second electrode 190, thereby reducing the manufacturing cost of the organic light emitting display device.

According as the voltage drop, which is caused by the resistance increase of the second electrode 190, is prevented, it is possible to prevent the power consumption from being increased, and also to realize the uniform luminance, thereby improving reliability of the organic light emitting display device.

Also, since the encapsulation substrate 200 of the metal material serves the heat insulating function, there is no need to provide the additional heat insulating plate, thereby maximizing lightness and thinness in the organic light emitting display device.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. An organic light emitting display device comprising:
a substrate;
a first electrode on the substrate;

an organic light emitting layer on the first electrode;
a second electrode on the substrate including the organic light emitting layer;
an encapsulation substrate confronting the substrate; and
an auxiliary electrode in a non light-emission area of the substrate, the auxiliary electrode including:
    a barrier extending from the substrate towards the encapsulation substrate without contacting the encapsulation substrate such that a space exists between a top of the barrier and the encapsulation substrate, and
    a connection electrode extended from the second electrode and being formed on and around the barrier to fill the space between the top of the barrier and the encapsulation substrate such that the auxiliary electrode directly contacts the substrate and the encapsulation substrate,
wherein the encapsulation substrate is formed of a metal material, and is electrically connected with the second electrode,
wherein the second electrode and the encapsulation substrate are electrically connected to each other through the auxiliary electrode,
wherein the auxiliary electrode is not disposed in a region between pixels, and
wherein the encapsulation substrate does not include an insulating material.

2. The device of claim 1, wherein the encapsulation substrate includes:
a base film formed of a metal material including magnesium (Mg);
a connection layer formed of a conductive metal material on a first surface of the base film so as to enable an electrical connection with the second electrode; and
a metal oxide layer formed on a second surface of the base film in opposite to the first surface of the base film.

3. The device of claim 2, wherein the connection layer is formed of an alloy of magnesium (Mg) and at least any one metal material selected from argentum (Ag), titanium (Ti), tungsten (W), and iron (Fe).

4. The device of claim 2, wherein the metal oxide layer is formed by performing an anodizing or plasma treatment on the second surface of the base film.

5. The device of claim 1, wherein the barrier is formed in a closed loop surrounding a light-emission area on the non light-emission area of the substrate.

6. The device of claim 2, further comprising:
a sealing pattern interposed between the substrate and the encapsulation substrate to bond the substrate and the encapsulation substrate to each other.

7. The device of claim 6, wherein the sealing pattern includes:
a first sealing pattern surrounding the auxiliary electrode along a circumference of the auxiliary electrode.

8. The device of claim 7, wherein the first sealing pattern is provided in a closed loop of a frame shape.

9. The device of claim 7, wherein the sealing pattern further includes:
a second sealing pattern covering a light-emission area.

10. The device of claim 9, wherein the sealing pattern is interposed between the second electrode and the encapsulation substrate in the light-emission area.

11. The device of claim 9, wherein the second sealing pattern is surrounded by the auxiliary electrode.

12. An organic light emitting display device comprising:
a substrate;
a first electrode on the substrate;
an organic light emitting layer on the first electrode;
a second electrode on the substrate including the organic light emitting layer;
an encapsulation substrate confronting the substrate; and
an auxiliary electrode in a non light-emission area of the substrate, wherein the auxiliary electrode includes:
    a barrier formed in a closed loop surrounding a light-emission area on the non light-emission area of the substrate,
    the barrier extending from the substrate towards the encapsulation substrate without contacting the encapsulation substrate such that a space exists between a top of the barrier and the encapsulation substrate, and
    a connection electrode extended from the second electrode towards the substrate to directly contact the substrate, and then extended toward the encapsulation substrate and formed on and around the barrier to fill the space between the top of the barrier and the encapsulation substrate such that the auxiliary layer directly contacts the substrate and the encapsulation substrate,
wherein the encapsulation substrate is formed of a metal material, and is electrically connected with the second electrode,
wherein the second electrode and the encapsulation substrate are electrically connected to each other through the auxiliary electrode,
wherein the auxiliary electrode is not disposed in a region between pixels, and
wherein the encapsulation substrate does not include an insulating material.

* * * * *